(12) United States Patent
Okada et al.

(10) Patent No.: US 6,570,180 B2
(45) Date of Patent: May 27, 2003

(54) ORGANIC LIGHT-EMITTING DEVICE CAPABLE OF HIGH-QUALITY DISPLAY

(75) Inventors: Hiroyuki Okada, Toyama (JP); Shigeru Tabatake, Toyama (JP); Shigeki Naka, Toyama-ken (JP); Hiroyoshi Onnagawa, Toyama (JP)

(73) Assignee: President of Toyama University, Toyama (JP)

( * ) Notice: Subject to any disclaimer, the term of this patent is extended or adjusted under 35 U.S.C. 154(b) by 0 days.

(21) Appl. No.: 10/105,277

(22) Filed: Mar. 26, 2002

(65) Prior Publication Data

US 2002/0139986 A1 Oct. 3, 2002

(30) Foreign Application Priority Data

Mar. 27, 2001 (JP) ......................................... 2001-089412

(51) Int. Cl.$^7$ .......................... H01L 35/24; H01L 51/00
(52) U.S. Cl. .......................................... 257/40; 257/103
(58) Field of Search ................................... 257/40, 103

(56) References Cited

U.S. PATENT DOCUMENTS

| | | | |
|---|---|---|---|
| 5,885,368 A | * | 3/1999 | Lupo et al. |
| 5,949,089 A | * | 9/1999 | Kim et al. |
| 6,395,411 B1 | * | 5/2002 | Kwon et al. |
| 6,433,357 B1 | * | 8/2002 | Kuijk et al. |

FOREIGN PATENT DOCUMENTS

EP  0298628 A2  *  1/1989

OTHER PUBLICATIONS

Yongtaek Hong, et al., "Organic Light Emitting Devices on Plastic Flexible Substrates: New Cathode and Light Emissive Materials", Proc. 20th IDRC, Sep. 24, 2000, pp. 183–186.

C. W. Tang, et al., "Organic Electroluminescent Diodes", Appl. Phys. Lett., vol. 51, (12), Sep. 21, 1987, pp. 913–915.

C. W. Tang, et al., "Electroluminescence of Doped Organic Thin Films", j. Appl. Phys. vol. 65 (9), May 1, 1989, pp. 3610–3616.

Hitoshi Nakada, et al., "Inorganic and Organic Electroluminescence", Inorganic and Organic Electroluminenscence (EL96 Berlin), Edited by R. H. Mauch and H.–E. Gumlich, 1996, pp. 385–390.

Takeo Wakimoto, et al., "Organic EL Cells Using Alkaline Metal Compounds as Electron Injection Materials", IEEE Transactions on Electron Devices, vol. 44, No. 8, Aug. 1997, pp. 1245–1248.

L. S. Hung, et al., "Enhanced Electron Injection in Organic Electroluminescence Devices Using an Al/LIF Electrode", Appl. Phys. Lett.,vol. 70 (2), Jan. 13, 1997, pp. 152–154.

* cited by examiner

Primary Examiner—Stephen D. Meier
(74) Attorney, Agent, or Firm—Oblon, Spivak, McClelland, Maier & Neustadt, P.C.

(57) ABSTRACT

The object of the present invention is to provide an organic light emitting device which can be operated at a low voltage, and when such elements are used in a display panel, a light-emitting surface which can emit light uniformly over an entire display panel can be obtained when the conditions are maintained the same. The organic light-emitting device of the present invention includes a substrate having a light transmitting property in a visible range, a first electrode having a light transmitting property in a visible range, and formed on the substrate, a layer formed on the first electrode, and configured to emit light by recombination of excitons each made of a pair of a positive hole and electron injected thereto, and a second electrode containing erbium and formed on the layer.

8 Claims, 4 Drawing Sheets

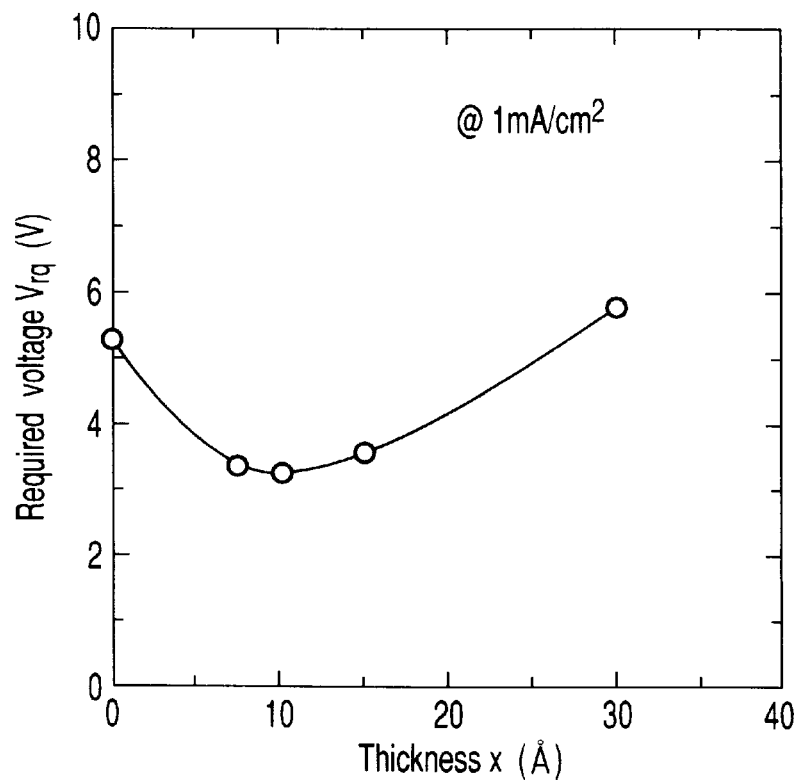
F I G. 10
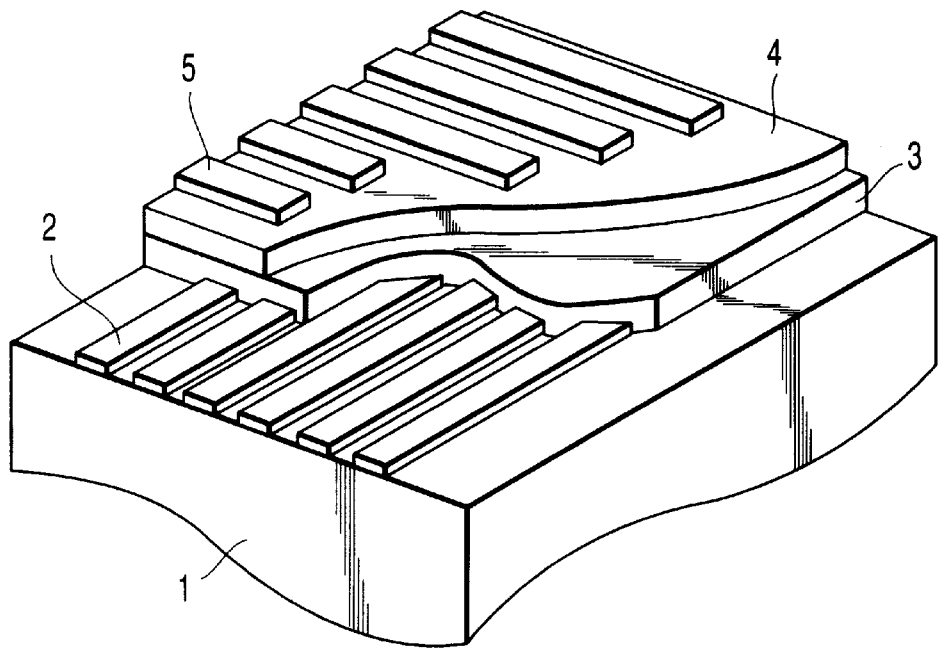
F I G. 11

ORGANIC LIGHT-EMITTING DEVICE CAPABLE OF HIGH-QUALITY DISPLAY

CROSS-REFERENCE TO RELATED APPLICATIONS

This application is based upon and claims the benefit of priority from the prior Japanese Patent Application No. 2001-089412, filed Mar. 27, 2001, the entire contents of which are incorporated herein by reference.

BACKGROUND OF THE INVENTION

1. Field of the Invention

The present invention relates to a cathode material of an organic light-emitting device and its structure, and more specifically, to an erbium electrode having characteristics of such a low work function that can enhance the efficiency of electron injection to an organic thin film, and a structure which can lower its contact resistance.

2. Description of the Related Art

As a man-machine interface of the recent information society, light-weight and compact flat display panels have become the focus of attention. The most popular device now used is the liquid crystal display, and its market share has now grown greater than that of the conventional CRT (cathode ray tube). However, the liquid crystal display now used is of a non-emissive type, and it cannot be monitored without external light. Under these circumstances, there is a great demand for development of a new type of display which is of an emissive type and whose total power consumption of the system is lower than that of a backlit liquid crystal display.

At present, much attention is being paid to the organic electro-luminescent device, that is, organic light-emitting device, as a device which can overcome the above-described drawbacks in the non-emissive type of the conventional liquid crystal display, which has superior characteristics to those of conventional liquid crystal displays.

In connection with the above, there have been reports regarding the organic light-emitting device. The first example is a report on an organic light-emitting device having the characteristics of high brightness, low driving voltage, small size, high efficiency, etc., published by C. W. Tang and S. A. VanSlyke in a magazine "Applied Physics Letters" in 1987 (C. W. Tang and S. A. VanSlyke: Applied Physics Letters, 51(12), PP. 913–915 (1987)). This publication was an epoch-making report on a device which improved the efficiency of the device by more than ten times that of the conventional organic light-emitting device, and such characteristics were achieved with a film formed of an organic dye, which can easily give rise to an amorphous film, by vacuum deposition, followed by making it extremely thin. According to this report, an external quantum efficiency of 1%, a visible light-emission efficiency of 1.51 m/W and a brightness of 1000 cd/m$^2$ were realized at a drive voltage of 10V or less. Further, a magnesium/silver alloy, which has a relatively small work function, was used as the cathode, in order to lower the voltage. At present, more than 10 years have passed since the publication of this report, and along with time, the efficiency of the organic light-emitting device has been improved further, and the lifetime of the element has been improved. In addition, the matrix panels are presently commercially available on the market.

The second example is a report published by C. W. Tang, S. A. VanSlyke and C. H. Chen, on an improvement of the light-emitting efficiency, which was achieved by mixing a dye having a high fluorescent quantum efficiency, such as a coumarin dye or a pyran derivative, into a light-emitting layer (C. W. Tang, S. A. VanSlyke and C. H. Chen: Journal of Applied Physics, 65(9), PP. 3610–3616 (1989)).

The third example is a report published by H. Nakada and T. Tohma on the formation of a high-efficiency organic electric field light-emitting device. In this publication, it is reported that a light-emission efficiency of 121 m/W and a brightness of 100,000 cd/m$^2$ could be achieved when a Quinacridone derivative having a high fluorescent quantum efficiency was mixed into the light-emitting layer and an aluminum alloy containing lithium having a small work function was used as the cathode (H. Nakada and T. Tohma: Inorganic and Organic Electroluminescence (EL96 Berlin), (Edited by R. H. Mauch and H. -E. Gumlich) PP. 385–390 (1996)).

Here, it should be noted that the organic light-emitting device is of a type in which an organic film is impregnated with electrons and holes so as to create excitons, each of which is a pair of an electron and a hole, and light is emitted by recombination of an electron-hole pair. Therefore, the light-emission intensity of the organic light-emitting device is proportional to the amount of impregnated electrons and holes. Due to this characteristic, in order to realize a high-efficiency organic light-emitting device, it is necessary to apply a large electrical current at a low voltage into the device. Therefore, the use of a metal which can easily release electrons even at a low voltage, that is, having a low work function, is very effective.

However, low-work function metals, for example, an aluminum alloy containing lithium, are, in general, atmospherically unstable, as they are easily oxidized. For this reason, when such a metal is used for the organic light-emitting device, the device deteriorates quickly, which is undesirable. Under these circumstances, there has been a demand for development of a more stable cathode, together with an improved structure thereof.

The fourth example is a report published by T. Wakimoto, Y. Fukuda, K. Nagayama, A. Yokoi, H. Nakada and M. Tsuchida on a solution to the above-described problem, that is, manufacture of a stable organic light-emitting device. This was achieved by forming an extremely thin film of 1 nm or less, made of an oxide of a low work function metal such as lithium or cesium, as the cathode, on an organic layer, and then evaporating an aluminum electrode on the thin film (T. Wakimoto, Y. Fukuda, K. Nagayama, A. Yokoi, H. Nakada and M. Tsuchida: IEEEE Transaction on Electron Devices, 44(8), PP. 1245/1248 (1997)). It is stated in the fourth report that, with the above-described structure, it is possible to manufacture an organic light-emitting device exhibiting an excellent reproducibility and having a high efficiency.

There is further a report published by L. S. Hung, C. W. Tang and M. G. Mason, on a high-efficiency organic light-emitting device. This has a structure in which a fluoride layer of an extremely thin lithium film having a thickness of 1 nm or less is formed between an organic layer and an aluminum cathode layer (L. S. Hung, C. W. Tang and M. G. Mason: Applied Physics Letters, 70(2), PP. 153–154 (1997).

However, in the device discussed in the above report, insulator layers such as an oxide layer and a fluoride layer are formed extremely thin, and therefore due to a slight variation in thickness of these insulator layers, the drive voltage is increased or the non-light emitting portion is enlarged, which is undesirable. Thus, due to the variation in thickness of each insulator layer, the characteristics of the organic light-emitting device dramatically change. For this reason, especially in the case where an organic light-emitting device is manufactured on a large substrate, it is extremely important to maintain a uniform thickness of each insulator layer. In order to achieve this, it is further necessary to solve the drawbacks entailed in the manufacturing steps of the conventional technique.

BRIEF SUMMARY OF THE INVENTION

The present invention has been achieved as a solution to the above-described drawbacks entailed in the conventionally used cathode materials, and the object thereof is to provide an electrode structure for an organic light-emitting device which can display a high-quality image at a low voltage on a uniform light-emitting surface without using insulator intermediate layers such as extremely thin oxide layer and fluoride layer.

According to an aspect of the present invention, there is provided an organic light-emitting device including a substrate having a light transmitting property in a visible range, such as glass, quartz or resin; a first electrode having a light transmitting property in a visible range, formed on the substrate; a first organic layer having a positive hole transporting property, formed on the first electrode; a second organic layer having a positive hole transporting property and a light-emitting property and partially containing a metal element diffused throughout at least a part of the second organic layer, formed on the first organic layer; and a second electrode containing erbium, formed on the second organic layer.

According to another aspect of the present invention, there is provided an organic light-emitting device including: a substrate having a light transmitting property in a visible range, such as glass, quartz or resin; a first electrode having a light transmitting property in a visible range, formed on the substrate; a first organic layer having a positive hole transporting property, formed on the first electrode; a second organic layer having a positive hole transporting property and a light-emitting property and partially containing a metal element diffused throughout at least a part of the second organic layer, formed on the first organic layer; and a cathode having a two-layer structure including a second layer containing erbium and a third conductive layer.

According to still another aspect of the present invention, there is provided an organic light-emitting device characterized by comprising: a substrate having a light transmitting property in a visible range, such as glass, quartz or resin; a first electrode having a light transmitting property in a visible range, formed on the substrate; a first organic layer having a positive hole transporting property, formed on the first electrode; a second organic layer having a positive hole transporting property and a light-emitting property, formed on the first organic layer; and a cathode having a three-layer structure including a second electrode layer containing erbium, a third diffusion barrier electrode and a conductive electrode.

According to still another aspect of the present invention, there is provided an organic light-emitting device characterized by comprising: a substrate having a light transmitting property in a visible range, such as glass, quartz or resin; a first electrode having a light transmitting property in a visible range, formed on the substrate; a first organic layer having a positive hole transporting property, formed on the first electrode; a second organic layer having a positive hole transporting property and a light-emitting property, formed on the first organic layer; a super-thin insulating film having a thickness of 0.1 nm to 2 nm, formed on the second organic layer; and a cathode having a two-layer structure including a second electrode containing erbium and a third conductive electrode, or a cathode of a three-layer structure including a second electrode layer containing erbium, a third diffusion barrier electrode and a fourth conductive electrode.

According to still another aspect of the present invention, there is provided an organic light-emitting device characterized by comprising: a substrate having a light transmitting property in a visible range, such as glass, quartz or resin; a first electrode having a light transmitting property in a visible range, formed on the substrate; a first organic layer having a positive hole transporting property, formed on the first electrode; a second organic layer having an electron transporting property and a light-emitting property, partially containing erbium diffused throughout at least a part of the second organic layer and formed on the first organic layer; and a cathode of a second electrode formed on the second organic layer.

According to still another aspect of the present invention, there is provided an organic light-emitting device characterized by comprising: a substrate having a light transmitting property in a visible range; a first electrode having a light transmitting property in a visible range, formed on the substrate; a layer formed on the first electrode, and configured to generate light by recombination of excitons each made of a pair of a positive hole and electron injected thereto; and a second electrode containing erbium, formed on the layer.

According to still another aspect of the present invention, there is provided an organic light-emitting device characterized by comprising: a substrate having a light transmitting property in a visible range; a first electrode having a light transmitting property in a visible range, formed on the substrate; a first organic layer having a positive hole transporting property, formed on the first electrode; a second organic layer having an electron transporting property and light generating property, and formed on the layer; and a second electrode containing $ErF_3$, formed on the second organic layer.

According to still another aspect of the present invention, there is provided an organic light-emitting device flat panel display characterized by comprising: plurality of organic electric filed light-emitting devices described above, arranged in such a manner that light emission of each of the organic light-emitting device is controlled independently.

Additional objects and advantages of the invention will be set forth in the description which follows, and in part will be obvious from the description, or may be leaned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 10 is a graph illustrating the relationship between the thickness and voltage necessary for light emission in the second embodiment of the present invention in which $ErF_3$ is used; and FIG. 11 is a perspective and schematic diagram showing the internal structure of the electric field light-emitting device flat panel display according to the present invention.

DETAILED DESCRIPTION OF THE INVENTION

Embodiments of the present invention will now be described in detail with reference to accompanying drawings. The following embodiments are descriptions of practical examples of the present invention, which are designed to illustrate the general principle of the present invention with drawings. Therefore, the present invention is not limited to the specific structures of the following descriptions and accompanying drawings provided herein.

Figure 1:
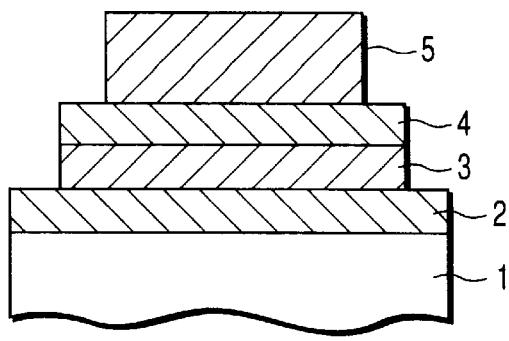
FIG. 1 is a cross sectional view of the electrode structure for an organic light-emitting device according to the first embodiment of the present invention.

FIG. 1 is a diagram showing the first embodiment of the organic light-emitting device according to the present invention. As shown in FIG. 1, the organic light-emitting device of this embodiment has a structure in which a first electrode 2 made of an electrode material which is light transmitting in a visible range, such as ITO (indium tin oxide), is formed on one side of a transparent substrate 1 made of, for example, glass, quartz or resin. The first electrode 2 is formed to have a thickness of, for example, about 100 nm, and a shape of stripes (not illustrated in the figure) at a predetermined pitch (for example, at a pitch of several tens to several hundreds micrometers ($\mu$m)), although it is not limited to this structure.

On the surface of the first electrode 2, a positive hole transport thin film 3 having a thickness of about 50 nm and made of a positive hole transport thin film material and an electron transport light-emitting thin film 4 having a thickness of about 50 nm and made of an electron transport light-emitting thin film material are formed in lamination. Further, on the surface of the electron transport light-emitting thin film 4, a second electrode 5 made of erbium, which is a trivalent rare-earth metal element, is formed to have an appropriate thickness, that is, 50 nm to 200 nm, and to have a stripe shape (not illustrated) at a predetermined pitch in a direction facing and normally crossing with the first electrode 2. Erbium, which is a heavy metal element, has a high work function (3.2 eV) as compared to that of lithium (2.9 eV) or cesium (2.2 eV), which is a low work function material of light metals which have been researched and developed mainly as an electron injection electrode material for the conventional organic light-emitting device. In the course of completing the present invention, the inventors have found that it is possible, with use of erbium, in spite of its high work function property, to obtain an electric property (see FIG. 6) and a light-emitting property (see FIG. 7) that are as good as the cases where lithium and cesium are employed, and are sufficient in practical use. In addition, erbium is stable in the atmosphere as compared to lithium or cesium, and therefore it can be easily handled. It should be noted that the second electrode, not only in this embodiment, but also in the other ones, which will be later described, may be made of an alloy of erbium and some other element such as aluminum or silver in accordance with necessity, in addition to the case where erbium is used solely as a single element.

Here, examples of the positive hole transport thin film material 3 are a triphenylamine derivative (such as TPD), a hydrazone derivative and arylamine derivative. Examples of the electron transport light-emitting thin film material are an alumiquinolinol complex ($Alq_3$), an oxadiazole derivative, a benzoxazolthiophen derivative, a perylene derivative and a phenanthroline derivative. Apart from the above, more than one thousand types are known as materials which can be selected as the positive hole transport thin film material and the electron transport light-emitting thin film material.

With regard to the required function of the light-emitting material, it suffices if the material is capable of generating light by, in any way, recombination of excitons which are pairs of positive holes and electrons injected to the layer. More specifically, materials having the positive hole transport function, the electron transport function, both the light-emitting function and bipolar (positive hole and electron) transport function, a combination of these polarities generating light, the light-emitting and electron transport function, the light-emitting and positive hole transport function, and the bipolar transport and light-emitting function can be used in accordance with necessity. Further, there are multi-function and versatile materials each having by itself a variety of functions mentioned above, and they can be selected in accordance with the situation.

An organic light-emitting device according to the technology of this embodiment can be manufactured, for example, in the following manner.

First, a first electrode material 2 is formed on a completely cleaned substrate 1, and then a positive hole transport thin film material and an electron transport light-emitting thin film material are further laminated thereon. Thus formed positive hole transport thin film 3 and electron transport light-emitting thin film 4 are described to be laminated thin film; however in practice, a laminate structure having either one of the positive hole transport function, the electron transport function and the light-emitting function, or two or more of these functions, may be used as the structure which falls within the scope of the present invention. Alternatively, it is possible that, after formation of the electron transport light-emitting thin film 4, a metal element such as erbium or praseodymium is diffused in this thin film 4 from its surface by an appropriate method, thereby forming an electron transport light-emitting thin film 4 partially containing a metal element diffused throughout at least a part of said second organic layer.

For the formation of thin films of the positive hole transport thin film material and the electron transport light-emitting thin film material, various methods can be used such as a vacuum deposition method which mainly handles low-molecular organic materials, a spin coat method and a cast method, which mainly handle high-molecular materials. All of these methods can be applied to the manufacture of the organic light-emitting device of the present invention.

Subsequent to the formation of a light-emitting layer, the second electrode 5 is formed of erbium. Here, it is preferable that the thickness of the second element 5 should be about 50 nm to 200 nm. Although it is not limited to this, the second electrode 5 may be formed to have a stripe shape (not illustrated) at a predetermined pitch in such a direction that it faces the first electrode 2 and normally crosses therewith. For formation of the second electrode 5, a mask evaporation is generally used, and the evaporation is performed from the vertical direction while covering the unnecessary portion for the electrode. Further, when it is necessary to form a micro-structure, a lithography method may be used to form a desired pattern.

After formation of the second electrode 5, a protection layer (not shown) is laminated fittingly thereon. The protection layer is made of, for example, a resin of phenol or epoxy, and it serves to protect the positive hole transport film 3, the electron transport light-emitting thin film 4 and the second electrode 5 from outside air. An alternative way to shut the organic light-emitting device from outside air, it is possible that the substrate 1, a sealing can, and glass or resin are bonded together and then an inert gas such as nitrogen or argon is sealed therein.

An example of the deposition step will now be briefly described. That is, the positive hole transport film 3, the electron transport light-emitting thin film 4 and the second electrode 5 are formed at vacuum pressure of $1 \times 10^{-5}$ Torr and a deposition rate of 1 nm/sec. It should be noted here that the positive hole transport film 3 and the electron transport light-emitting thin film 4 may be formed by way of some other thin film forming technology than the deposition, such as the spin coat method. Further, the second electrode 5 may be formed by way of some other vacuum thin film forming technology than the evaporation, such as sputtering.

Figure 2:
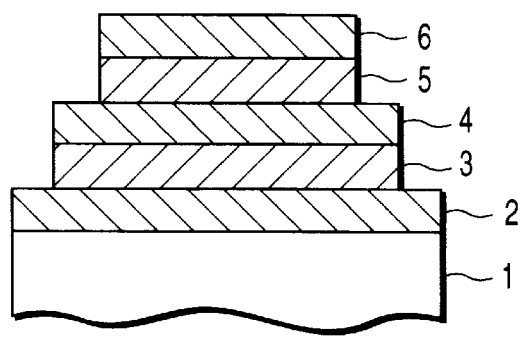
FIG. 2 is a cross sectional view of the electrode structure for an organic light-emitting device according to the second embodiment of the present invention.

FIG. 2 is a diagram showing the organic light-emitting device according to the second embodiment of the present invention. This embodiment is similar to the first embodiment except that, for example, a conductive layer having a conductivity higher than that of erbium is additionally formed on the erbium-containing layer of the second electrode 2.

For the formation of the erbium-containing layer, it is possible to use Er only, or a compound containing erbium, for example, in the form of $ErF_3$. The organic light-emitting device according to this embodiment has a structure shown in FIG. 2, in which a first electrode 2 made of an electrode material which is light transmitting in a visible range, such as ITO, is formed on one side of a transparent substrate 1 made of, for example, glass, quartz or resin. The first electrode 2 is formed to have a thickness of, for example, about 100 nm, and a shape of stripes (not illustrated in the figure) at a predetermined pitch, for example, at a pitch of several tens to several hundreds micrometers ($\mu$m). On the surface of the first electrode 2, a positive hole transport thin film 3 having a thickness of about 50 nm and made of a positive hole transport thin film material and an electron transport light-emitting thin film 4 having a thickness of about 50 nm and made of an electron transport light-emitting thin film material are formed in lamination. Further, on the surface of the electron transport light-emitting thin film 4, a second electrode 5 made of erbium or a layer containing erbium in the form of, for example, $ErF_3$, is formed to have an appropriate thickness, desirably, 1 nm to 200 nm, and to have a stripe shape (not illustrated) at a predetermined pitch in a direction facing and normally crossing with the first electrode 2. Then, on the surface of the electrode 5 made of erbium, an electrode containing, for example, Al or Ag, which has a high conductivity, is laminated.

An organic light-emitting device according to the technology of this embodiment can be manufactured, for example, in the following manner.

First, a positive hole transport thin film 3 and an electron transport light-emitting thin film 4 are formed in the same manner as in the first embodiment, and then the electrode 5 made of erbium is formed. This electrode 5 should be formed to have an appropriate thickness, desirably, 1 nm to 200 nm, and to have a stripe shape (not illustrated) at a predetermined pitch in a direction facing and normally crossing with the first electrode 2. The electrode 5 made of erbium can be formed generally by a mask deposition method. Here, the evaporation is performed from the vertical direction to evaporate the electrode material while covering the unnecessary portion for the electrode with a mask.

Subsequently, the electrode 6 having a high conductivity is formed on the surface of the erbium-made electrode 5. Examples of the material usable for this electrode 6 are conductive metals such as aluminum, gold, copper and chromium and conductive high polymers such as polyanilline and polypyrrol. With the electrode 6 having a high conductivity provided, it becomes possible to reduce the electric resistance on the cathode side, and therefore to improve the light-emitting property. Then, in accordance with necessity, a protection layer (not shown) is laminated fittingly thereon. The protection layer is made of, for example, a resin of phenol or epoxy, and it serves to protect the positive hole transport film 3, the electron transport light-emitting thin film 4, the erbium-made electrode 5 and the conductive electrode 6 from outside air. As an alternative way to shut the organic electric field light-emitting device from outside air, it is possible that the substrate 1, a sealing can, and glass or resin are bonded together and then an inert gas such as nitrogen or argon is sealed therein.

An example of the evaporation step will now be briefly described. That is, the positive hole transport film 3, the electron transport light-emitting thin film 4 and the erbium-made electrode 5 are formed at vacuum pressure of $1 \times 10^{-5}$ Torr and an evaporation rate of 1 nm/sec. It should be noted here that the positive hole transport film 3 and the electron transport light-emitting thin film 4 may be formed by way of some other thin film forming technology than the evaporation, such as the spin coat method. Further, the erbium-made electrode 5 and the conductive electrode 6 may be formed by way of some other vacuum thin film forming technology than the evaporation, such as sputtering.

Figure 3:
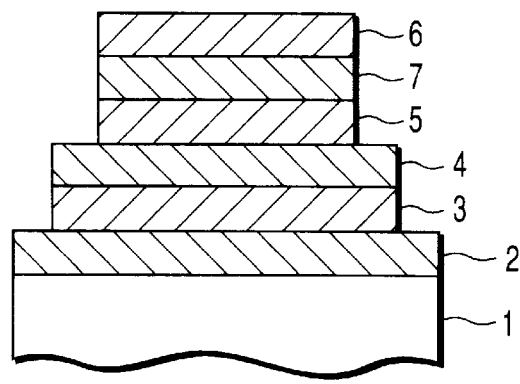
FIG. 3 is a cross sectional view of the electrode structure for an organic light-emitting device according to the third embodiment of the present invention.

FIG. 3 is a diagram showing the organic light-emitting device according to the third embodiment of the present invention. This embodiment is similar to the first embodiment except that a diffusion barrier layer are additionally formed on the erbium-containing layer of the second electrode 2. The organic light-emitting device according to this embodiment has a structure shown in FIG. 3, in which a first electrode 2 made of an electrode material which is light transmitting in a visible range, such as ITO (indium tin oxide), is formed on one side of a transparent substrate 1 made of, for example, glass, quartz or resin. The first electrode 2 is formed to have a thickness of, for example, about 100 nm, and a shape of stripes (not illustrated in the figure) at a predetermined pitch, for example, at a pitch of several tens to several hundreds micrometers ($\mu$m).

On the surface of the first electrode 2, a positive hole transport thin film 3 having a thickness of about 50 nm and made of a positive hole transport thin film material and an electron transport light-emitting thin film 4 having a thickness of about 50 nm and made of an electron transport light-emitting thin film material are formed in lamination. Further, on the surface of the electron transport light-emitting thin film 4, a second electrode 5 made of erbium is formed to have an appropriate thickness, desirably, 1 nm to 200 nm, and to have a stripe shape (not illustrated) at a predetermined pitch in a direction facing and normally crossing with the first electrode 2. Then, on the surface of the electrode 5 made of erbium, an electrode 7 made of a diffusion barrier layer having such a function of preventing the diffusion of substances which constitute a high-conductivity layer 6 formed at the surface as shown in FIG. 3, to the erbium-made electrode 5 and to the electron transport light-emitting thin film 4, is laminated. Further, on the surface of the diffusion barrier layer, the already-mentioned high-conductivity layer 6 is laminated.

An organic light-emitting device according to the technology of this embodiment can be manufactured, for example, in the following manner.

First, a positive hole transport thin film 3 and an electron transport light-emitting thin film 4 are formed in the same manner as in the first and second embodiments, and then the electrode 5 made of erbium is formed. It is desirable that this electrode should be formed to have a thickness of 1 nm to 200 nm, and to have a stripe shape (not illustrated) at a predetermined pitch in a direction facing and normally crossing with the first electrode 2. The electrode 5 made of erbium can be formed generally by a mask evaporation method. Here, the evaporation is performed from the vertical direction to evaporate the electrode material while covering the unnecessary portion for the electrode with a mask. Then, a diffusion barrier electrode 7 is formed on the surface of the electrode 5. Usable examples of the material for the diffusion barrier electrode are titanium, titanium nitride, titanium tungsten, etc. The thickness of the diffusion barrier electrode should preferably be, 5 to 100 nm, and more preferably, it should be 15 to 25 nm.

Subsequently, the electrode 6 having a conductivity is formed on the surface of the diffusion barrier electrode 7. Examples of the material usable for this electrode 6 are conductive metals such as aluminum, gold, copper and chromium and conductive high polymers such as polyaniline and polypyrrol. Then, in accordance with necessity, a protection layer (not shown) is laminated fittingly thereon. The protection layer is made of, for example, a resin of phenol or epoxy, and it serves to protect the positive hole transport film 3, the electron transport light-emitting thin film 4, the erbium-made electrode 5 which gives rise to the second electrode, the diffusion barrier electrode 7 and the conductive electrode 6 from outside air.

As an alternative way to shut the organic light-emitting device from outside air, it is possible that the substrate 1, a sealing can, and glass or resin are bonded together and then an inert gas such as nitrogen or argon is sealed therein.

An example of the evaporation step will now be briefly described. That is, the positive hole transport film 3, the electron transport light-emitting thin film 4 and the erbium-made electrode 5 are formed at vacuum pressure of $1 \times 10^{-5}$ Torr and an evaporation rate of 1 nm/sec. It should be noted here that the positive hole transport film 3 and the electron transport light-emitting thin film 4 may be formed by way of some other thin film forming technology than the evaporation, such as the spin coat method. Further, the erbium-made electrode 5, the diffusion barrier electrode and the conductive electrode 6 may be formed by way of some other vacuum thin film forming technology than the evaporation, such as sputtering.

Figure 4:
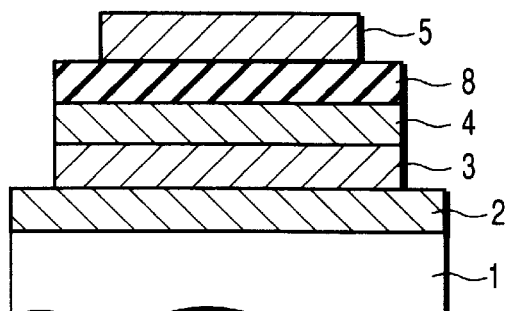
FIG. 4 is a cross sectional view of the electrode structure for an organic light-emitting device according to the fourth embodiment of the present invention.

FIG. 4 is a diagram showing the organic light-emitting device according to the fourth embodiment of the present invention. This embodiment is similar to the first to third embodiments in structure, except that an extremely thin insulating film is additionally formed on the organic layer having properties of electron transportation and light emission. The organic light-emitting device according to this embodiment has a structure shown in FIG. 4, in which a first electrode 2 made of an electrode material which is light transmitting in a visible range, such as ITO (indium tin oxide), is formed on one side of a transparent substrate 1 made of, for example, glass, quartz or resin. The first electrode 2 is formed to have a thickness of, for example, about 100 nm, and a shape of stripes (not illustrated in the figure) at a predetermined pitch, for example, at a pitch of several tens to several hundreds micrometers ($\mu$m).

On the surface of the first electrode 2, a positive hole transport thin film 3 having a thickness of about 50 nm and made of a positive hole transport thin film material and an electron transport light-emitting thin film 4 having a thickness of about 50 nm and made of an electron transport light-emitting thin film material are formed in lamination. Further, on the surface of the electron transport light-emitting thin film 4, a super-thin insulating layer having a function as an electron injection buffer layer, and having a thickness of, for example, 0.1 to 2 nm or more preferably 0.1 to 1 nm, is formed. After that, a second electrode 5 made of erbium is formed to have an appropriate thickness, desirably, 1 nm to 200 nm, and to have a stripe shape (not illustrated) at a predetermined pitch in a direction facing and normally crossing with the first electrode 2. Then, on the surface of the electrode 5 made of erbium, an electrode having a high conductivity is laminated. Here, alternatively, it is possible to laminate an electrode having a conductivity on the surface of the erbium-made electrode 5. Or it is also possible that a diffusion barrier electrode is laminated on the surface of the erbium-made electrode 5 and a conductive electrode is further laminated on the surface of the diffusion barrier electrode.

An organic light-emitting device according to the technology of this embodiment can be manufactured, for example, in the following manner.

First, a positive hole transport thin film 3 and an electron transport light-emitting thin film 4 are formed in the same manner as in the first and second embodiments, and then the insulating super-thin film is formed thereon by, for example, an evaporation method. Usable examples of the material for the insulating super-thin film are oxides or fluorides of erbium, lithium and cesium.

Next, an electrode 5 made of erbium is formed. This electrode 5 should be formed to have an appropriate thickness, desirably, 1 nm to 200 nm, and to have a stripe shape (not illustrated) at a predetermined pitch in a direction facing and normally crossing with the first electrode 2. The electrode 5 made of erbium can be formed generally by a mask evaporation method. Here, the evaporation is performed from the vertical direction to evaporate the electrode material while covering the unnecessary portion for the electrode with a mask.

Alternatively, a conductive electrode may be formed on the surface of the erbium-made electrode 5. Examples of the material usable for this electrode 6 are conductive metals such as aluminum, gold, copper and chromium and conductive high polymers such as polyanilline and polypyrrol.

Or it is also possible that a diffusion barrier electrode is formed on the surface of the erbium-made electrode 5. Usable examples of the material for the diffusion barrier electrode are titanium, titanium nitride, titanium tungsten, etc. In this case, a conductive electrode should be formed on the surface of the diffusion barrier electrode. Examples of the material usable for this electrode are conductive metals such as aluminum, gold, copper and chromium and conductive high polymers such as polyanilline and polypyrrol.

Then, a protection layer (not shown) is laminated fittingly thereon. The protection layer is made of, for example, a resin of phenol or epoxy, and it serves to protect the positive hole transport film 3, the electron transport light-emitting thin film 4, the erbium-made electrode, the diffusion barrier electrode and the conductive electrode from outside air. As an alternative way to shut the organic light-emitting device from outside air, it is possible that the substrate 1, a sealing can, and glass or resin are bonded together and then an inert gas such as nitrogen or argon is sealed therein.

The deposition conditions for the formation of the films will now be briefly described. That is, the positive hole transport film 3, the electron transport light-emitting thin film 4 and the erbium-made electrode 5 are formed at vacuum pressure of $1 \times 10^{-5}$ Torr and a deposition rate of 1 nm/sec. It should be noted here that the positive hole transport film 3 and the electron transport light-emitting thin film 4 may be formed by way of some other thin film forming technology than the evaporation, such as the spin coat method. Further, the erbium-made electrode 5, the diffusion barrier electrode and the conductive electrode may be formed by way of some other vacuum thin film forming technology than the evaporation, such as sputtering.

Figure 5:
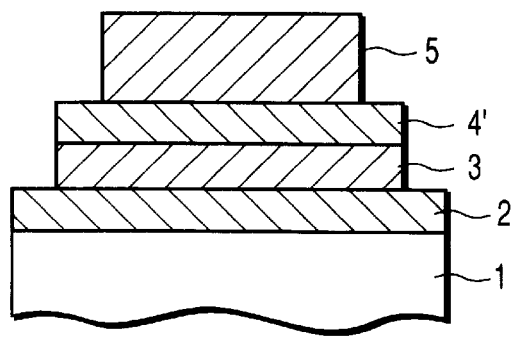
FIG. 5 is a cross sectional view of the electrode structure for an organic light-emitting device according to the fifth embodiment of the present invention.

FIG. 5 is a diagram showing the organic light-emitting device according to the fifth embodiment of the present invention. This embodiment has a structure shown in FIG. 5, in which a first electrode 2 made of an electrode material which is light transmitting in a visible range, such as ITO, is formed on one side of a transparent substrate 1 made of, for example, glass, quartz or resin. The first electrode 2 is formed to have a thickness of, for example, about 100 nm, and a shape of stripes (not illustrated in the figure) at a predetermined pitch, for example, at a pitch of several tens to several hundreds micrometers ($\mu$m). On the surface of the first electrode 2, a positive hole transport thin film 3 having a thickness of about 50 nm and made of a positive hole transport thin film material and an electron transport light-emitting thin film 4 having a thickness of about 50 nm and made of an electron transport light-emitting thin film material are formed in lamination. In the upper surface portion of the electron transport light-emitting thin film 4', desirably within a range of 10 nm to 49 nm from the surface, a metal element such as erbium or praseodymium is mixed. Meanwhile, a second electrode is formed on the electron transport light-emitting thin film 4' in such a manner that the electrode 5 has an appropriate thickness, desirably, 50 nm to 200 nm, and has a stripe shape (not illustrated) at a predetermined pitch in a direction facing and normally crossing with the first electrode 2.

An organic light-emitting device according to the technology of this embodiment can be manufactured, for example, in the following manner.

First, a positive hole transport thin film 3 is formed in the same manner as in the first embodiment, and then an electron transport light-emitting thin film 4' is formed thereon to have thickness of about 50 nm. Here, it is preferably that when the thickness of the film becomes 1 nm to 40 nm, a layer mixed with erbium is formed thereon. The mixture ratio between the electron transport light-emitting thin film material and this element such as erbium should preferably be within a range of 10:90 to 90:10 um, and it can be appropriately adjusted.

Then, a second electrode 5 having a conductivity is formed on a second organic layer. Examples of the material usable for the second electrode 5 are conductive metals such as erbium, aluminum, gold, copper and chromium and conductive high polymers such as polyanilline and polypyrrol. The second electrode 5 should be formed to have an appropriate thickness, desirably, 50 nm to 200 nm, and to have a stripe shape (not illustrated) at a predetermined pitch in a direction facing and normally crossing with the first electrode 2. The second electrode 5 can be formed generally by a mask evaporation method. Here, the evaporation is performed from the vertical direction to evaporate the electrode material while covering the unnecessary portion for the electrode with a mask.

Then, in accordance with necessity, a protection layer (not shown) is laminated fittingly thereon. The protection layer is made of, for example, a resin of phenol or epoxy, and it serves to protect the positive hole transport film 3, the electron transport light-emitting thin film 4', and the second electrode 5 from outside air. As an alternative way to shut the organic light-emitting device from outside air, it is possible that the substrate 1, a sealing can, and glass or resin are bonded together and then an inert gas such as nitrogen or argon is sealed therein.

The evaporation method employed the formation of the films will now be briefly described. That is, the positive hole transport film 3, the electron transport light-emitting thin film 4' and the second electrode 5 are formed at vacuum pressure of $1 \times 10^{-5}$ Torr and a evaporation rate of 1 nm/sec. While forming the electron transport light-emitting thin film, the layer mixed with erbium is formed when the thin film is evaporated to have a thickness of, desirably, about 10 nm to 49 nm. Here, the mixing can be performed by co-evaporation from two evaporation sources. It should be noted here that the positive hole transport film 3 and the electron transport light-emitting thin film 4' may be formed by way of some other thin film forming technology than the evaporation, such as the spin coat method. Further, the second electrode 5 may be formed by way of some other vacuum thin film forming technology than the evaporation, such as sputtering.

Figure 6:
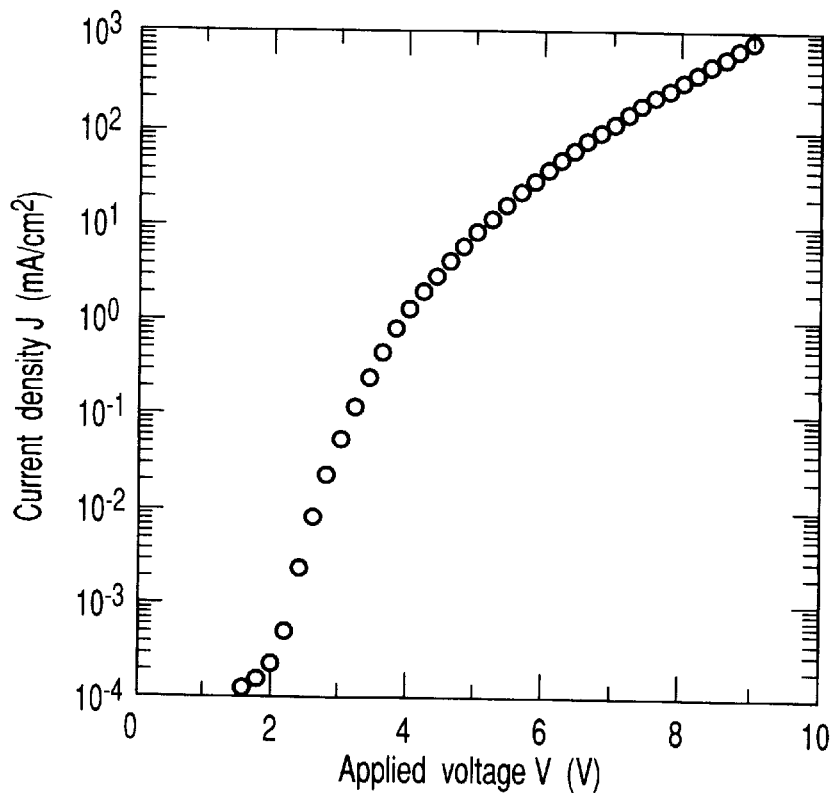
FIG. 6 is a graph illustrating the characteristics of current density and applied voltage of the light-emitting device according to the first embodiment of the present invention.
Figure 7:
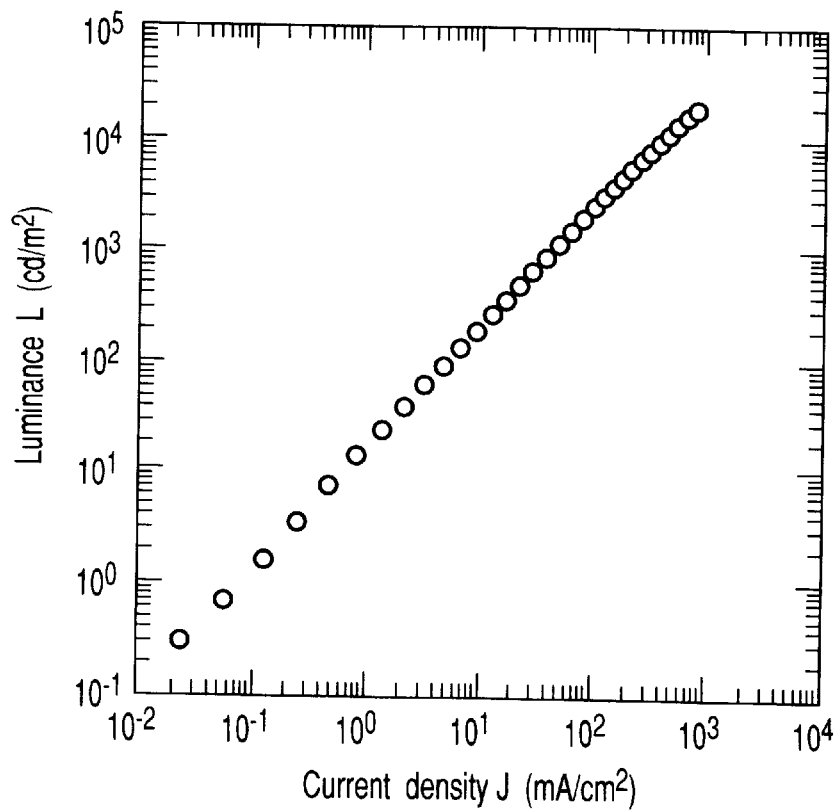
FIG. 7 is a graph illustrating the characteristics of the brightness of emitted light and current density of the light-emitting device according to the first embodiment of the present invention.

Next, the characteristics of an organic light-emitting device actually manufactured were illustrated in FIGS. 6 and 7. Thus manufactured element had a structure of (ITO/TPD (50 nm)/Alq$_3$ (50 nm)/Er (2 nm) Al. FIG. 6 illustrates the characteristics regarding the current density with respect to the applied voltage, and FIG. 7 illustrates the characteristic regarding the brightness of the light emitted with reference to the current density. As is clear from FIG. 6, it was observed that the current rose up at a voltage low as about 2V. Further, it was found that the light emission started from a low voltage of 2.8V. As the voltage increased, it was observed that an extremely high brightness of 10,000 cd/m$^2$ was obtained at a voltage of 10V or less, and the brightness of the light was uniform over the entire surface of the light-emitting panel despite such a high brightness. Further, the deterioration in the characteristics of the light-emitting device along with time was observed to be extremely indistinctive.

Figure 8:
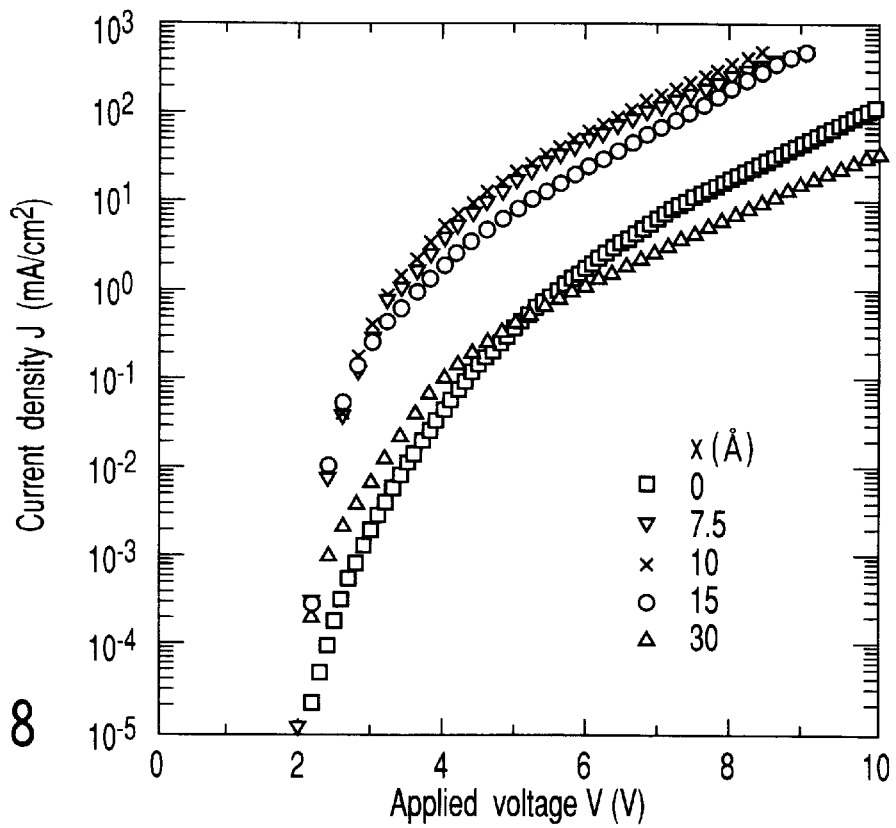
FIG. 8 is a graph illustrating the characteristics of current density and applied voltage of the light-emitting device according to the second embodiment of the present invention in which $ErF_3$ is used.
Figure 9:
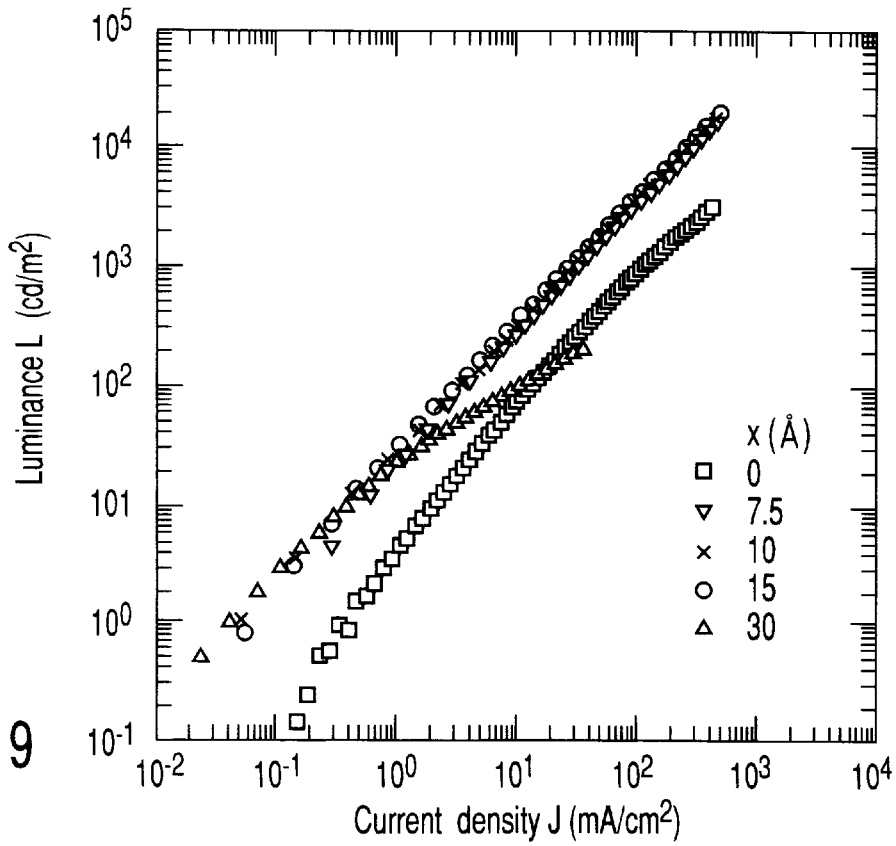
FIG. 9 is a graph illustrating the characteristics of the brightness of light emitted and current density of the light-emitting device according to the second embodiment of the present invention in which $ErF_3$ is used.

FIG. 8 is a graph illustrating the characteristics of the current density of the light emitting device and the applied voltage in the second embodiment when $ErF_3$ is used. The graph illustrates the cases where the thickness of $ErF_3$ is varied to 7.5, 10, 15 and 30 angstrom. For comparison, the case where no $ErF_3$ is not contained is also illustrated (in mark of □). It can be understood from this graph that the thickness of $ErF_3$ should be set to 7.5 to 15 angstroms. FIG. 9 is a graph illustrating the characteristics of the current density of the light emitting device and the applied voltage in the second embodiment when $ErF_3$ is used. It can be understood from this graph also that the thickness of $ErF_3$ should be set to 7.5 to 15 angstroms. FIG. 10 is a graph illustrating the relationship between the thickness of the element and the voltage necessary for light emission when $ErF_3$ is used in the second embodiment.

FIG. 11 is a diagram illustrating an example of the structure of the flat panel display according to the present invention. The flat panel display has such a structure in which a great number of pixels are arranged in plane. Note that each pixel is made of an light-emitting device discussed in one of the first to fifth embodiments. In the light-emitting device flat panel, the light emission of the devices is controlled one by one. As the technique of independently controlling the light emission of each light-emitting device, the conventionally well-known method used for conventional flat panel displays can be employed. According to an example of such a method, pixels made of light-emitting devices are arranged substantially in matrix as shown in FIG. 11 and the stripe portions of the first electrode 2 and the stripe portions of the second electrode 5, which are arranged normally to those of the first electrode, are scanned one after another. With this structure, each pixel is made of the respective light-emitting device located at the respective section where electrode portions normally cross with each other, and the intensity of the light emission of each pixel is controlled by adjusting the voltage applied to that pixel. Alternatively, it is possible to form a color display by fittingly arranging light-emitting devices including light-emitting layers of different recombination energy levels.

Several embodiments of the present invention have been described with reference to drawings. However, additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

As described, according to the present invention, there can be provided a high-quality organic light emitting device whose characteristics do not deteriorates along with time and which can be operated at a low voltage, and when such devices are used in a display panel, a light-emitting surface which can emit light uniformly over an entire display panel can be obtained when the conditions are maintained the same.

What is claimed is:

1. An organic light-emitting device comprising:
a substrate having a light transmitting property in a visible range;
a first electrode having a light transmitting property in a visible range, and formed on said substrate;
a first organic layer having a positive hole transporting property, and formed on said first electrode;
a second organic layer having a positive hole transporting property and a light-emitting property, and formed on said first organic layer; and
a second electrode containing erbium, and formed on said second organic layer,
wherein said second organic layer partially contains a metal element diffused throughout at least a part of said second organic layer.

2. An organic light-emitting device comprising:
a substrate having a light transmitting property in a visible range;
a first electrode having a light transmitting property in a visible range, and formed on said substrate;
a first organic layer having a positive hole transporting property, and formed on said first electrode;
a second organic layer having a positive hole transporting property and a light-emitting property, and formed on said first organic layer; and
a second electrode formed on said second organic layer,
wherein said second electrode is of a two-layer structure including a layer containing erbium and a conductive layer formed on said erbium-containing layer, and said second organic layer partially contains a metal element diffused throughout at least a part of said second organic layer.

3. An organic light-emitting device comprising:
a substrate having a light transmitting property in a visible range;
a first electrode having a light transmitting property in a visible range, and formed on said substrate;
a first organic layer having a positive hole transporting property, and formed on said first electrode;
a second organic layer having a positive hole transporting property and a light-emitting property, and formed on said first organic layer; and
a second electrode formed on said second organic layer,
wherein said second electrode is of a three-layer structure including a layer containing erbium, a diffusion barrier layer and a conductive layer laminated one on another in order.

4. An organic light-emitting device comprising:
a substrate having a light transmitting property in a visible range;
a first electrode having a light transmitting property in a visible range, and formed on said substrate;
a first organic layer having a positive hole transporting property, and formed on said first electrode;
a second organic layer having a positive hole transporting property and a light-emitting property, and formed on said first organic layer;
a super-thin insulating film having a thickness of 0.1 nm to 2 nm, and formed on said second organic layer; and
a second electrode formed on said super-thin insulating film,
wherein said second electrode is one of an electrode containing erbium, an electrode of a two-layer structure including a layer containing erbium and a conductive layer and an electrode of a three-layer structure including a layer containing erbium, a diffusion barrier layer and a conductive layer laminated one on another in order.

5. An organic light-emitting device comprising:
a substrate having a light transmitting property in a visible range;
a first electrode having a light transmitting property in a visible range, and formed on said substrate;

a first organic layer having a positive hole transporting property, and formed on said first electrode;

a second organic layer having an electron transporting property and a light-emitting property, and formed on said first organic layer; and a second electrode formed on said second organic layer, wherein said second organic layer partially contains a metal element diffused throughout at least a part of said second organic layer.

6. An organic light-emitting device comprising:

a substrate having a light transmitting property in a visible range;

a first electrode having a light transmitting property in a visible range, and formed on said substrate;

a layer formed on said first electrode, and configured to generate light by recombination of excitons each made of a pair of a positive hole and electron injected thereto; and a second electrode containing erbium and formed on said layer.

7. An organic light-emitting device comprising:

a substrate having a light transmitting property in a visible range;

a first electrode having a light transmitting property in a visible range, and formed on said substrate;

a first organic layer having a positive hole transporting property, and formed on said first electrode;

a second organic layer having an electron transporting property and light generating property, and formed on said layer; and a second electrode containing $ErF_3$, formed on said second organic layer.

8. An organic light-emitting device flat panel display comprising:

a plurality of organic electric filed light-emitting devices according to any one of claims 1 to 7 arranged in such a manner that light emission of each of the organic electric filed light-emitting devices is controlled independently.

* * * * *